United States Patent [19]
Kadomura

[11] Patent Number: 5,314,576
[45] Date of Patent: May 24, 1994

[54] DRY ETCHING METHOD USING $(SN)_x$ PROTECTIVE LAYER

[75] Inventor: Shingo Kadomura, Kanagawa, Japan

[73] Assignee: Sony Corporation, Tokyo, Japan

[21] Appl. No.: 895,693

[22] Filed: Jun. 9, 1992

[51] Int. Cl.$^5$ ............................................. H01L 21/00
[52] U.S. Cl. ................................ 156/655; 156/643; 156/646; 156/662; 156/656; 156/657; 156/665
[58] Field of Search ............... 156/643, 646, 662, 665, 156/655, 656, 657, 659.1

[56] References Cited
U.S. PATENT DOCUMENTS

| | | | |
|---|---|---|---|
| 4,465,552 | 8/1984 | Bobbio et al. | 156/646 |
| 4,579,623 | 4/1986 | Suzuki et al. | 156/643 |
| 4,855,017 | 8/1989 | Douglas | 156/643 |
| 4,992,136 | 2/1991 | Toehi et al. | 156/659.1 |
| 4,992,137 | 2/1991 | Cathey et al. | 156/643 |

FOREIGN PATENT DOCUMENTS

| | | |
|---|---|---|
| 61-097835 | 5/1986 | Japan . |
| 61-220432 | 9/1986 | Japan . |
| 64-008628 | 1/1989 | Japan . |
| 1-166539 | 6/1989 | Japan . |
| 2-162730 | 6/1990 | Japan . |

OTHER PUBLICATIONS

"Semiconductor Damage from Inert and Molecular Gas Plasmas"; Seaward et al., J. Vac. Sci. Tech B; vol. 10 (1), pp. 46–abstract only; 1992; USA.
"D.C. Plasma Etching of Silicon by Sulfur Hexafluoride"; Wagner et al.; abstract only; Plasma Chem Proc. 1(2); USA.
"Integrated Circuit Fabrication Technology"; David Elliot, ed.; McGraw-Hill Book Co.; ©1982; pp. 304–307; U.S.A.

*Primary Examiner*—Brian E. Hearn
*Assistant Examiner*—George Goudreau
*Attorney, Agent, or Firm*—Hill, Steadman & Simpson

[57] ABSTRACT

A dry etching method whereby high anisotropy can be achieved while providing sidewall protection effects by using an appropriate alternative substance to a carbonaceous polymer. A target material layer is etched by using etching gas containing a nitrogen based compound and a sulfur based compound capable of forming free sulfur (S) in a plasma when dissociated by electric discharges while a pattern sidewall is protected by a sulfur nitride based compound occurring from the gaseous phase. The sulfur nitride based compound is composed mainly of polythiazyl $(SN)_x$, which causes no particle pollution because it will be removed from a wafer through sublimation or decomposition when the wafer is heated to temperatures above 130° C. For instance, a polysilicon layer or an Al based material layer can be etched into an anisotropic shape by using $S_2Cl_2/N_2$ mixed gas. Particularly, a silicon based compound layer can be etched while preventing chloroflurocarbon (CFC) gas effectively. The sidewall protection film composed of $(SN)_x$ has such excellent resistance to attacks by radicals or incident ions that a pattern formed into an anisotropic shape will not be deformed even when over-etched with radicals.

25 Claims, 6 Drawing Sheets

DRY ETCHING METHOD USING (SN)$_x$ PROTECTIVE LAYER

BACKGROUND OF THE INVENTION

1. Field of the Invention

The present invention relates to a dry etching method employed in such applications as production of semiconductor devices. More particularly, it relates to a dry etching method whereby high anisotropy can be achieved while providing sidewall protection effects by using an appropriate alternative substance to carbonaceous polymers. Further, the present invention relates to a dry etching method whereby generation of etching residues or attachments, deformation of the sectional shape of patterns, and other problems can be prevented, for instance, in a multi-level metallization process involving a large-scale over-etching process for metallization layers on wafers having large steps on the surface thereof.

2. Description of the Related Art

The recent trend toward larger-scale integration and higher performance of such semiconductor devices as VLSIs and ULSIs requires dry etching methods whereby correspondingly higher anisotropy, higher etchrate, higher selectivity, lower pollution, and less damage can be achieved with no compromise in these requirements in etching silicon based material layers such as single-crystal silicon, polysilicon, refractory metal silicide, and polycide layers, or aluminum based material layers.

A typical etching process for single-crystal silicon based layers is a trench forming process wherein a trench is formed for the purposes of isolating minute elements and securing cell capacitor areas. This process requires high anisotropy in order to allow filling of the trench in subsequent processes and accurate control of capacitance.

Meanwhile, a typical etching process for polysilicon, amorphous silicon, refractory metal silicide, and polycide layers is a gate electrode forming process wherein a pattern width directly affects a channel length in self-aligned formation of a transistor's source and drain regions and a sidewall size accuracy in an LDD structure. As such, this process also requires high anisotropy together with high selectivity for thin gate oxide films.

Further, a typical etching process for aluminum based material layers is, needless to say, a interconnection forming process. A problem peculiar to this process is how to prevent after-corrosion.

The recent trend toward three-dimensional device structures and resulting expansion of steps on the surface of a target wafer requires a large-scale over-etching process. Namely, if the steps expand, it is more likely that various material layers formed thereon become irregular in thickness and that wafer surface morphology effects work to decrease the quantity of etchant incident on such narrow sections as the bottoms of the steps and lower the vapor pressure on etching reaction products. Consequently, after completion of a just-etching process, etching residues called stringers sometimes remain on the bottoms of the steps and require removal in an over-etching process.

It is generally difficult in an over-etching process, however, to make high anisotropy compatible with high selectivity because an excessive quantity of radicals relative to an etching area cause migration on the surface of a target wafer and attack the sidewalls of patterns, deforming the sectional shape of patterns. Meanwhile, any attempt to set ion assisted etching conditions for fear of lower anisotropy causes damage to underlying layers or allows sputtered underlying layers to attach to the sidewalls of patterns. It is preferable to prevent generation of such attachments, which will occlude residual chlorine and promote after-corrosion, particularly when etching aluminum based material layers formed on silicon oxide ($SiO_2$) based inter-layer insulation films.

Conventionally, sidewall protection effects using carbonaceous polymers have played a major role in solving the above-mentioned problems.

Chloroflurocarbon (CFC), typically, CFC 113 ($C_2Cl_3F_3$), has been widely used to etch silicon based material layers. CFC gas has fluorine (F) and chlorine (Cl) atoms in each molecule thereof and will generate, under certain conditions, such radials as F* and Cl* and such ions as C+, $CF_x$+, $CCl_x$+, and Cl+, both of which will assist an etching reaction. When the CFC gas is dissociated by electric discharges, the resulting fragments thereof will polymerize to form in a plasma carbonaceous polymer, which will deposit on a pattern sidewall on the surface of a target wafer, providing sidewall protection effects and thereby achieving high anisotropy.

It is possible to make high anisotropy compatible with high selectivity by improving the sidewall protection effects provided by the carbonaceous polymer. The principle of this method is to reduce the energy of incident ions with no compromise in a practical etchrate and thereby achieve high selectivity while preventing the resulting anisotropy deterioration by improving the sidewall protection effects. A typical example of this method is publicized in, for instance, the Extended Abstract of the 36th Spring Meeting of the Japan Society of Applied Physics and Related Societies, 1989, p. 571, 1p - L - 5. In this instance, a tungsten polycide film is etched via an $SiO_2$ mask by $C_2Cl_3F_3$ (CFC 113) / $SF_6$ mixed gas.

For Al based material layers, a carbonaceous polymer supplied by a resist mask provides sidewall protection effects. To etch Al based material layers, chlorine based gases, typically, $BCl_3/Cl_2$ mixed gas, have been widely used. Because Al and Cl react with each other spontaneously, a mean free path of ions must be extended during etching under low gas pressure and high bias in order to ensure high anisotropy. When the resist mask is sputtered by high-energy incident ions, the resulting decomposition products will form a carbonaceous polymer, which will deposit on a pattern sidewall, providing sidewall protection effects.

Another method for achieving high anisotropy has also been proposed wherein the temperature of a target substrate (wafer) is reduced instead of providing sidewall protection effects by using the carbonaceous polymer. Called low-temperature etching, this method is designed to keep the wafer at temperatures below 0° C. and thereby keep a longitudinal etchrate at a practical level with the assistance of ions while freezing or inhibiting a radical reaction on the sidewalls of patterns and preventing such etching defects as undercut. A typical example of this method is publicized, for instance, in the Extended Abstract of the 35th Spring Meeting of the Japan Society of Applied Physics and Related Societies, 1988, p. 495, 28a - G - 2. In this instance, a silicon trench and an n+ type polysilicon layer are etched by using SF₆ gas with a wafer cooled to −130° C.

In this connection, it is to be noted that low-temperature etching in the broad sense thereof sometimes means a dry etching method wherein a wafer is kept at room temperature, considering that the wafer, unless cooled, will be heated to temperatures around 200° C. under the influence of radiation from a plasma or heat of reaction.

However, it has been pointed out that the above-mentioned methods of providing sidewall protection effects by using a carbonaceous polymer involve problems described below.

Firstly, CFC gas, typical of etching gases for silicon based material layers, is commonly known to contribute to destruction of the earth's ozone layer and the production and use thereof are likely to be prohibited in the near future. Under these circumstances, there is pressing need to find some appropriate alternative substance, and the efficient applications thereof, to CFC gas for use in dry etching.

Secondly, when silicon based material layers are etched by using CFC gas, carbon contained therein deteriorates selectivity for $SiO_2$ based material layers. This problem is publicized in, for instance, the Extended Abstract of the 36th Spring Meeting of the Japan Society of Applied Physics and Related Societies, 1989, p. 572, 1p - L - 7 and the Monthly Journal "Semiconductor World" (published by the Press Journal Inc.), January, 1990, p. 81–84. In these instances, carbon contained in CFC gas adsorbs on the surface of an $SiO_2$ based material layer like a gate oxide film to form a C—O bond with a high bond energy (257 kcal / mole) and weaken an Si—O bond or to reduce $SiO_2$ to Si and make it more likely to be extracted by a halogenous etchant. This problem becomes particularly serious in forming a gate electrode on a thin gate oxide film.

Thirdly, there is a fear that a carbonaceous polymer may cause particle pollution and after-corrosion. Namely, it is most likely that a carbonaceous polymer occurring from the gaseous phase causes more serious particle pollution as design rules for semiconductor devices become more strict in the future. Particularly, in an etching process for Al based material layers, a carbonaceous polymer deposited on the sidewalls of patterns will occlude chlorine or compounds thereof, which will act as residual chlorine to promote after-corrosion. In recent years, an increasing number of electromigration prevention measures, such as adding copper (Cu) to Al based material layers and fabricating therewith such dissimilar material layers as barrier metals and anti-reflection films have been taken. Since all these measures work against after-corrosion prevention, it is required to find some appropriate alternative sidewall protection substance to a carbonaceous polymer.

There have also been proposed some measures for using other depositional gases than CFC gas. As design rules for semiconductor devices become more strict in the future, there is a greater fear that even minute particles which would otherwise be negligible may lead to considerable yield reduction.

On the other hand, low-temperature etching is expected to be one of promising CFC-free etching methods. As mentioned above, however, this method attempts to achieve high anisotropy only by freezing or inhibiting a radical reaction on the sidewalls of patterns and involves cooling a target substrate (wafer) to such a degree that requires liquid nitrogen. Hence, hardware related problems, such as increased demand for large-scale special cooling equipment and decreased reliability of vacuum sealant. Also anticipated is the fear that additional time taken to cool the wafer below room temperature and heat it back to room temperature leads to reduction in throughput as well as economy and productivity.

OBJECT AND SUMMARY OF THE INVENTION

It is therefore an object of the present invention to provide a dry etching method whereby sidewall protection effects can be provided by an appropriate alternative substance to a carbonaceous Polymer while ensuring high anisotropy and little damage in an over-etching process, and low pollution and high economy.

To accomplish the above-mentioned object, the present inventor herein proposes a dry etching method wherein the alternative sidewall protection substance is such that it will deposit only under certain conditions with a view to preventing particle pollution, can be removed easily when unnecessary by any one of the measures of sublimation, decomposition, and volatile substance formation, and can withstand attacks by ions or excessive radicals and wherein an over-etching process is assisted mainly by radicals for the purposes of avoiding adverse effects to underlying layers and removing etching residues from such narrow sections as the bottoms of steps on the surface of a target wafer. Thus, the alternative sidewall protection substance serves to protect a pattern sidewall from attacks by excessive radicals.

As the alternative sidewall protection substance, the present inventor herein proposes sulfur nitride compounds.

As mentioned later, there are known various types of the above-mentioned sulfur nitride compounds, of which polythiazyl $(SN)_x$ is particularly excellent in providing sidewall protection effects in the present invention. The property and composition of $(SN)_x$ are described in detail in J. Am. Chem. Soc., Vol. 29, p. 6358–6363 (1975). $(SN)_x$ is a polymerized compound that will remain stable up to temperatures around 208° C. under atmospheric pressure and 140° to 150° C. under a reduced pressure. In a crystalline state, it is so structured that principal chains each composed of repetitive covalent bonds S—N—S—N—- - - are oriented in parallel to one another. Consequently, when sulfur nitride based compounds, typically $(SN)_x$, are deposited on a layer, they effectively inhibit F* and other radicals from invading the layer. Even when accelerated incident ions strike the layer, $(SN)_x$ will produce so-called sponge effects derived from changes in the bond angle, conformation, and other property thereof to absorb or alleviate the impact of the ions on the layer. Further, $(SN)_x$ will decompose or sublime for perfect removal immediately when heated to temperatures around 140° to 150° C. under a reduced pressure.

According to the present invention, $(SN)_x$ comes from the etching gas which contains a nitrogen based compound and a sulfur based compound capable of forming free sulfur in a plasma when dissociated by electric discharges. Thus, the two compounds will react with each other to form in the gaseous phase a sulfur nitride based compound, which will deposit on the surface of a target wafer, providing sidewall protection effects.

Most typical of the above-mentioned sulfur nitride based compounds is a thiazyl compound represented by a general formula $(SN)_x$. The simplest process of forming a thiazyl compound is that nitrogen and sulfur formed in a plasma through dissociation of a nitrogen based compound and a sulfur based compound respectively by electric discharges will combine with each other to form thiazyl (N≡S), which has unpaired electrons analogous to that of an oxygen analog, nitrogen oxide (NO), and polymerizes easily to form $(SN)_2$, $(SN)_4$, and $(SN)_x$. $(SN)_2$ polymerizes easily at temperatures around 20° C. to form $(SN)_4$ and $(SN)_x$, and decomposes at temperatures around 30° C. $(SN)_4$ is a cyclic compound with a melting point of 178° C. and a decomposition point of 206° C. $(SN)_x$ is a chemically stable compound which will not decompose at temperatures below 130° C. Accordingly, if a target wafer is kept at temperatures below room temperature, $(SN)_x$ will remain stable on the wafer.

When F*, Cl*, Br*, and other halogen radicals are also present besides sulfur and nitrogen in a plasma, the resulting halogen atoms may combine with the sulfur atom of $(SN)_x$ to form thiazyl halide. Further, when hydrogen based gas is added to regulate the quantity of F* formed in a plasma, the resulting hydrogen may combine with the sulfur atom of $(SN)_x$ to form hydrogen thiazyl.

Under some conditions, the above-mentioned sulfur nitride based compounds may be $S_4N_2$ (melting point: 23° C.), $S_{11}N_2$ (melting point: 150°–155 C.), $S_{15}N_2$ (melting point: 137° C.), $S_{16}N_2$ (melting point: 122° C.) and other cyclic sulfur nitride compounds containing much more sulfur atoms than nitrogen atoms, as well as $S_7NH$ (melting point: 113.5° C.), 1, 3–$S_6$ (NH)$_2$ (melting point: 130° C.), 1,4–$S_6$ (NH)$_2$ (melting point: 133° C.), 1, 5–$S_6(NH)_2$ (melting point: 155° C.) , 1, 3, 5–$S_5$ (NH)$_3$(melting point: 124° C.), 1, 3, 6 –$S_5$ (NH)$_3$ (melting point: 131° C.) , $S_4$ (NH)$_4$ (melting point: 145° C.), and other imido compounds composed of hydrogen atoms combined with the nitrogen atoms of the above-mentioned cyclic sulfur nitride compounds.

All the above-mentioned sulfur nitride based compounds will remain stable at the same temperature as on a wafer supporting electrode provided on an ordinary dry etcher and form a sidewall protection film thick enough to Protect a pattern sidewall from attacks by radicals.

According to the present invention, the deposition and etching processes for the above-mentioned sulfur nitride based compounds compete with each other in an etching reaction system, thus achieving high anisotropy.

Further, according to the present invention, a just-etching process is followed by an over-etching process which is mainly assisted by radicals and wherein the above-mentioned sulfur nitride based compounds provide highly excellent sidewall protection effects, thus eliminating the fear of deforming patterns formed into an isotropic shape.

Still further, according to the present invention, the above-mentioned sulfur nitride based compounds can be removed from a wafer through decomposition by heating the wafer to temperatures above 130° C. or removed together with a resist mask through sublimation, combustion, or decomposition during ordinary $O_2$ plasma ashing. The resulting reaction products are such gases as nitrogen ($N_2$), nitrogen oxides ($No_x$), and sulfur oxides ($SO_x$) or solid sulfur vapor, none of which causes particle pollution.

As is clear from the foregoing description, a dry etching method according to the present invention uses sulfur nitride based compounds as an alternative sidewall protection substance to a carbonaceous polymer, thus providing an effective prevention measure for CFC gas in etching silicon based compound layers and improving selectivity for resist or resistance to after-corrosion in etching Al based material layers. The sulfur nitride based compounds will deposit on a wafer at the same temperature as on a wafer supporting electrode provided on an ordinary dry etcher and cause lower pollution than the carbonaceous polymer. Further, the sulfur nitride based compounds provide highly excellent sidewall protection effects, thus achieving high anisotropy and little damage even in a large-scale over-etching process assisted mainly by radicals.

Accordingly, the present invention is particularly useful for such industrial applications as production of high performance large-scale integrated semiconductor devices conforming to strict design rules.

BRIEF DESCRIPTION OF THE DRAWINGS

FIG. 1a shows a stage where a resist mask was formed on an polysilicon layer. FIG. 1b shows a stage where the polysilicon layer was etched to form a gate electrode. FIG. 1c shows a stage where the resist mask was removed together with a sidewall protection film.

FIG. 3a shows a stage where a resist mask was formed on a polycide film. FIG. 3b shows a stage where a $WSi_x$ layer was etched. FIG. 3c a polysilicon layer was etched to form a gate electrode. FIG. 3d shows a stage where the resist mask was removed together with a sidewall protection film.

DETAILED DESCRIPTION OF THE INVENTION

The following paragraphs describe some preferred Examples of the present invention.

EXAMPLE 1

In this preferred Example, a dry etching method according to the present invention is applied to a gate electrode forming process where a polysilicon layer is etched by using $S_2Cl_2/N_2$ mixed gas. This process is described by referring to FIGS. 1a to 1c.

Figure 1A:
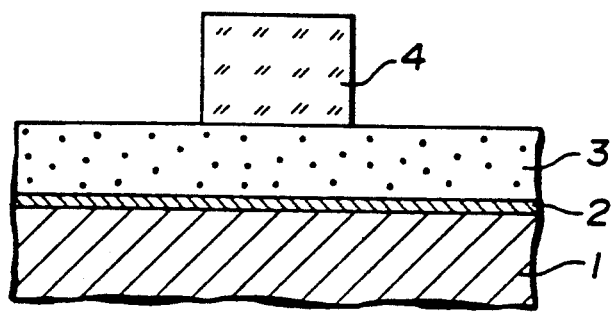
FIGS. 1a–1c are schematic sectional views showing the stages of a dry etching method applied in one preferred embodiment to a polysilicon gate electrode forming process.

Referring first to FIG. 1a, a single-crystal silicon substrate 1 is provided on the surface thereof with a gate oxide film 2 composed of $SiO_2$, a polysilicon layer 3 doped with n-type impurities and formed into a thickness of about 0.3 $\mu$m, and a resist mask 4 patterned into a predetermined shape, which are fabricated in this order. The resist mask 4 is composed, for instance, of novolac based positive photoresist (Supplied by Tokyo Ohka Kogyo Co., Ltd.; Product name: TSMR - V3) exposed to g-lines and developed and is then patterned into a thickness of about 0.5 um.

The sample wafer thus formed was set on a wafer supporting electrode provided on an RF biased magnetically enhanced microwave plasma etcher and cooled to a predetermined temperature by appropriate refrigerant (ethanol refrigerant in this Example) which was fed from an external cooling system, for instance, a chiller for circulation through a cooling pipe housed in the wafer supporting electrode. In this state, the polysilicon layer 3 was etched, for instance, under the following conditions:

$S_2Cl_2$ flow rate: 10 SCCM
$N_2$ flow rate: 10 SCCM
Gas pressure: 1.3 Pa (10 mTorr)
Microwave power: 850 W (2.45 GHz)
RF bias power: 30 W (2 MHz)
Wafer temperature: 20° C.

Figure 1B:
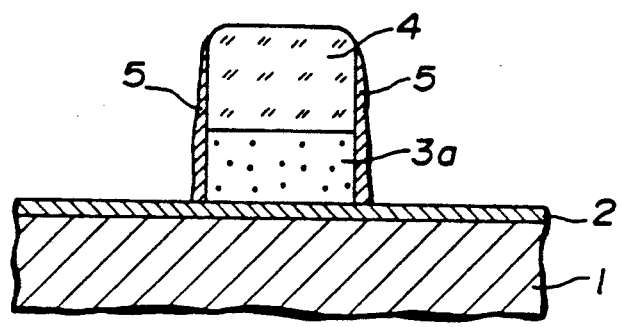

In the above-mentioned etching conditions, $S_2Cl_2$ is one of the sulfur chlorides proposed by the present inventor as highly effective CFC-free etching gas for silicon based material layers or Al based material layers. $S_2Cl_2$ released $Cl^*$, which acted as a main etchant for the polysilicon layer 3 and reacted with the assistance of such ions as $SF_x{}^+$, $S^+k$, $N^+$ to promote etching. Further, $S_2Cl_2$ also released S, which reacted with $N_2$ to form sulfur nitride based compounds, $(SN)_x$ for instance, in a plasma. With the wafer kept at 20° C., these sulfur nitride based compounds deposited on the pattern sidewall, on which no incident ion struck in principle, and formed a sidewall protection film as shown in FIG. 1b. Consequently, a gate electrode 3a was formed into a highly anisotropic shape.

Meanwhile, $N_2$ also formed $N^*$, which served to capture some of $F^*$ formed by $S_2F_2$ for removal from the etching system in the form of $NF_3$, etc. and thereby served to increase the S / F ratio (i.e. the ratio of the number of S atoms to that of F atoms) of the etching system and promote formation of sulfur nitride based compounds.

In this Example, high selectivity was also achieved partly due to considerable etchrate reduction when the deposition and sputtering processes for sulfur nitride based compounds competed with each other on the top surface of the resist mask 4, the exposed surface of the gate oxide film 2, and other surfaces struck by incident ions and partly due to reduction of necessary incident ion energy for anisotropic etching when the products occurring from the gaseous phase were applied to sidewall protection. Specifically, the resist mask 4 and the gate oxide film 2 were etched with a selectivity of about 10 and 30 respectively.

Figure 1C:
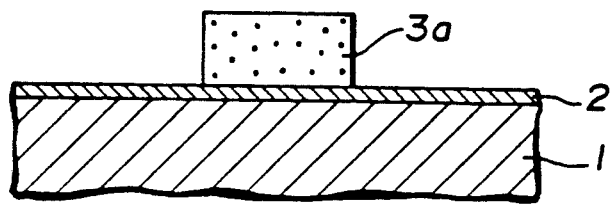

Referring then to FIG. 1c, when the wafer was set on a plasma ashing apparatus to undergo ordinary $O_2$ ashing, the resist mask 4 was removed. Then, the sidewall protection film 5, which was composed of sulfur nitride based compounds, was immediately removed from the etching system through decomposition, combustion, or sublimation under the influence of radiation from the plasma or heat of reaction as well as direct combustion by $O^*$. Consequently, no particle pollution was observed on the wafer.

It is to be noted that most sulfur nitride based compounds will be decomposed when heated to temperatures around 150° C. Therefore, it is also possible to first remove the sidewall protection film 5 by heating the target wafer around 90° C. and then remove the resist mask 4 through $O_2$ plasma ashing.

According to the present invention, sulfur nitride based compounds can be removed still more completely by means for preventing excessive deposition thereof on the inside of the etcher during etching. For instance, one recommended means for preventing particle pollution is to heat those internal members of the etcher, like the inner wall of the etching chamber, which exert no direct influence on the temperature of the wafer by such means as a heater housed in the etcher.

EXAMPLE 2

Figure 2:
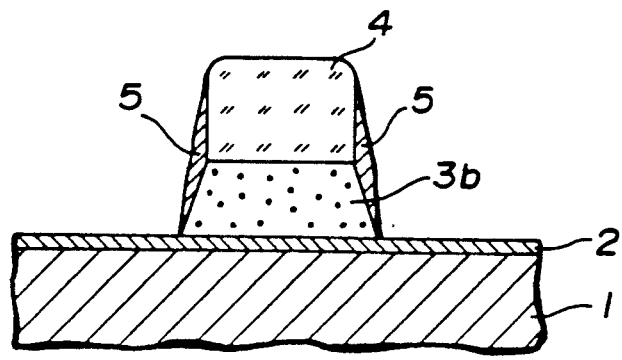
FIG. 2 is a schematic sectional view showing a stage of a dry etching method applied in another preferred embodiment to a polysilicon gate electrode forming process where a sidewall protection film was deposited to an excessive thickness to form a tapered gate electrode.

In this preferred Example, a dry etching method according to the present invention is applied to a gate electrode forming process where a polysilicon layer is etched by using $S_2Cl_2$ / $N_2$ / $H_2S$ mixed gas. This process is described by referring to FIG. 2 besides FIG. 1a.

Referring first to FIG. 1a, the same sample wafer as used in the first Example was set on a wafer supporting electrode provided on a magnetically enhanced microwave plasma etcher. In this state, the polysilicon layer 3 was etched, for instance, under the following conditions:

$S_2Cl_2$ flow rate: 10 SCCM
$N_2$ flow rate: 10 SCCM
$H_2S$ flow rate: 3 SCCM
Gas pressure: 1.3 Pa (10 mTorr)
Microwave power: 850 W (2.45 GHz)
RF bias power: 30 W (2 MHz)
Wafer temperature: 20° C.

In this Example, $H_2S$ was added to etching gas used in Example 1 as shown in the above-mentioned etching conditions. $H_2S$ released $H^*$, which served to capture $Cl^*$. At the same time, $H_2S$ also released free S, which served to effectively increase the apparent S / X ratio (i.e. the ratio of the number of S atoms to that of halogen (X) atoms) of the etching system. Consequently, $H_2S$ served to promote formation of the sidewall protection film 5 composed mainly of $(SN)_x$ and a tapered gate electrode 3b.

Thus, it is possible according to the present invention to vary the sectional shape of formed patterns by regulating the quantity of deposited sulfur nitride based compounds. For instance, if a first polysilicon layer is tapered as mentioned above in a CCD manufacturing process, a step coverage for an inter-layer insulation film will be improved to make it easier to prevent generation of stringers in etching the subsequent polysilicon layers.

EXAMPLE 3

In this preferred Example, a dry etching method according to the present invention is applied to a gate electrode forming process where a tungsten polycide film is etched in two stages by $S_2F_2$ / $N_2$ mixed gas and $S_2Br_2$ / $N_2$ mixed gas. This process is described by referring to FIGS. 3a to 3d.

Figure 3A:
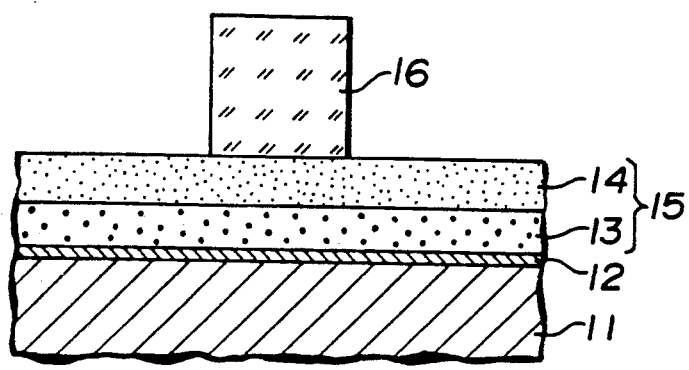
FIGS. 3a–3d are schematic sectional views showing the stages of a dry etching method applied in still another preferred embodiment to a polycide gate electrode forming process.

Referring first to FIG. 3a, a single-crystal silicon substrate 11 is provided on the surface thereof with a gate oxide film 12 composed of $SiO_2$, a polycide film 15, and a resist mask 16 patterned into a predetermined shape, which are fabricated in this order. The polycide film 15 is composed of a polysilicon layer 13 doped with n-type impurities and formed to a thickness of about 0.1 $\mu$m and a tungsten silicide ($WSi_x$) layer 14 formed into a thickness of about 0.1 $\mu$m, which are fabricated in this order.

The sample wafer thus formed was set on a wafer supporting electrode provided on an RF biased magnetically enhanced microwave plasma etcher. In this state, the $WSi_x$ layer 14 was first etched, for instance, under the following conditions:
$S_2F_2$ flow rate: 10 SCCM
$N_2$ flow rate: 10 SCCM
Gas pressure: 1.3 Pa (10 mTorr)
Microwave power: 850 W (2.45 GHz)
RF bias power: 30 W (2 MHz)
Wafer temperature: 20° C.

Figure 3B:
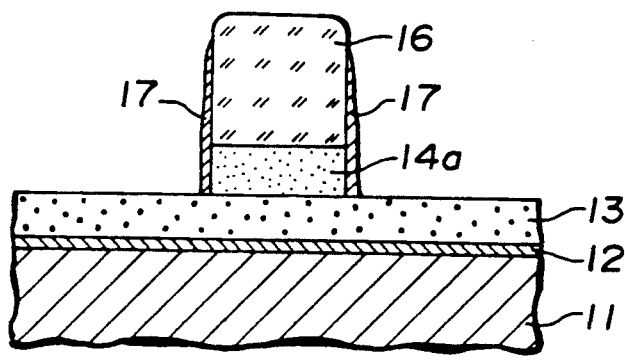

In the above-mentioned etching conditions, $S_2F_2$ is one of the sulfur fluorides proposed by the present inventor as etching gas for silicon based material layers and other material layers in the Proceedings on the 4th MicroProcess Conference (1991), p. 32. $S_2F_2$ released F*, which acted as a main etchant for the $WSi_x$ layer 14 and reacted with the assistance of such ions as $SF_x^+$ and $S^+$ to promote etching. Further, sulfur nitride based compounds, typically $(SN)_x$, formed a sidewall protection film 17 by the same mechanism as in Example 1. Consequently, an $WSi_x$ pattern 14a was formed into a highly anisotropic shape as shown in FIG. 3b.

Conventionally, $WSi_x$ layers used to be etched by using F based gas instead of Cl based gas and Br based gas, because these gases will form $WCl_x$ or $WBr_x$ respectively, whose vapor pressure is too low to allow etching, or because these products, even if they allow etching, will attach in excessive quantities to a pattern sidewall, making anisotropic etching difficult. However, when F based gas is used, the resulting F* will also cause another big problem of anisotropy deterioration. To ensure high anisotropy, therefore, it has been customary to provide sidewall protection effects by using a carbonaceous polymer or cool a target wafer as low as $-60°$ C.

According to the present invention, sulfur nitride based compounds will form the sidewall protection film 17 easily almost at room temperatures, thus realizing far more practical etching processes than before.

Then, the polysilicon layer 13 was etched, for instance, under the following conditions.
$S_2Br_2$ flow rate: 10 SCCM
$N_2$ flow rate: 10 SCCM
Gas pressure: 1.3 Pa (10 mTorr)
Microwave power: 850 W (2.45 GHz)
RF bias power: 30 W (2 MHz)
Wafer temperature: 20° C.

Figure 3C:
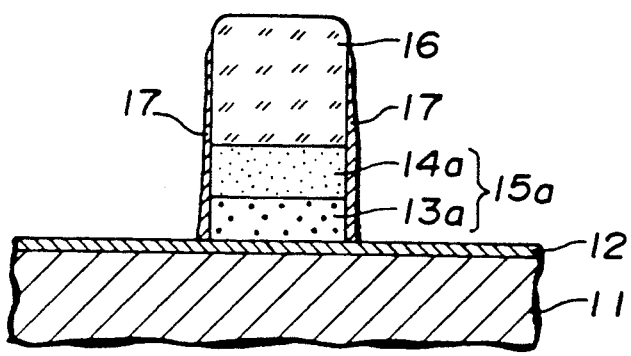

In the above-mentioned etching conditions $S_2Br_2$ was substituted for $S_2F_2$ in order that F* may be removed from the etching system and that Br* released from $S_2Br_2$ may act as a main etchant for the polysilicon layer 13 to improve selectivity for the underlying gate oxide film 12. As in Example 1, sulfur nitride based compounds formed a sidewall protection film 17. Consequently, a gate electrode 15a was formed into a highly anisotropic shape as shown in FIG. 3c. Incidentally, individual material layer patterns formed after etching are identified by a subscript "a" added to the numerals for corresponding material layers.

In this Example, the resist mask 16 and the gate oxide film 12 were etched with a selectivity of about 8 and 100 respectively. Thus, selectivity for the resist mask 16 is slightly lower than that for the resist mask 4 in Example 1. This is because the resist mask 16 was etched slightly by F* released from $S_2F_2$ when the $WSi_x$ layer 14 was etched.

Figure 3D:
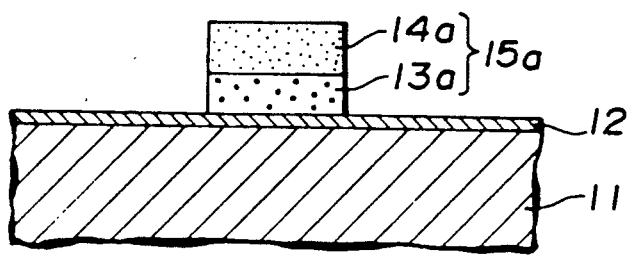

Referring finally to FIG. 3d, when the wafer was subjected to $O_2$ plasma ashing, the resist mask 16 and the sidewall protection film 17 were removed without causing any particle pollution.

EXAMPLE 4

In this preferred Example, a dry etching method according to the present invention is applied to an SRAM bit line forming process where a tungsten polycide film was first just-etched by using $S_2F_2$ / $N_2$ mixed gas and then over-etched by using $SF_6$ gas to remove etching residues. This process is described by referring to FIGS. 4 to 7.

Figure 4:
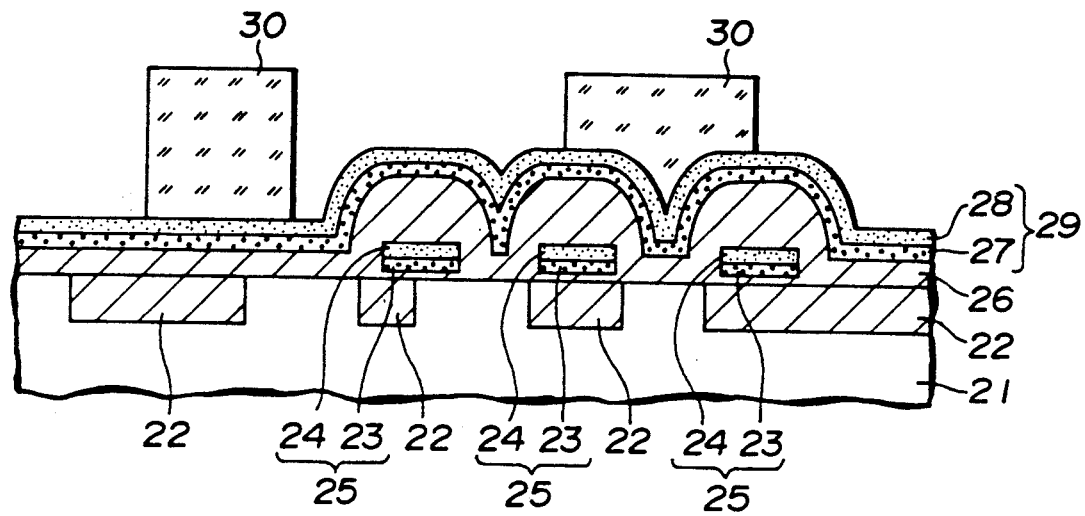
FIG. 4 is a schematic sectional view showing a stage of a dry etching method applied in still another preferred embodiment to an SRAM bit line forming process where a resist mask was formed on a second polycide film.

Referring first to FIG. 4, there is illustrated a schematic sectional view showing the structure of a sample wafer to be etched according to the present Example. A single-crystal silicon substrate 21 has shallow-trench element isolation areas 22 embedded in the surface thereof and is provided on the surface thereof via an $SiO_2$ gate oxide film with word lines 25 as a first-layer polycide film. Each of the word lines 25 consists of a polysilicon layer 23 and a $WSi_x$ layer 24, which are fabricated in this order. The wafer is coated on the whole surface thereof It with an inter-layer insulation film 26 formed of $SiO_2$ deposited, for instance, through chemical vapor deposition (CVD). The inter-layer insulation film 26 is coated on the surface thereof with a second-layer polycide film 29. The second-layer polycide film 29 consists of a polysilicon layer 27 and a $WSi_x$ layer 28, which are fabricated in this order, and constitutes part of a bit line to be formed. Further, the second-layer polycide film 29 is provided on the surface thereof with a resist mask 30, which is composed of chemical amplification negative three-component photoresist (Supplied by Shipley Co., Ltd.; Product name: SAL-601) formed, for instance, into a thickness large enough to absorb steps on the surface of the wafer, selectively exposed with a KrF excimer laser stepper, and developed with alkali.

The sample wafer thus formed was set on a wafer supporting electrode provided on an RF biased magnetically enhanced microwave plasma etcher. In this state, the second-layer polycide film 29 was etched, for instance, under the following conditions:
$S_2F_2$ flow rate: 35 SCCM
$N_2$ flow rate: 15 SCCM
Gas pressure: 1.3 Pa (10 mTorr)

Microwave power: 850 W (2.45 GHz)
RF bias power: 100 W (2 MHz)
Wafer temperature: −30° C.

Figure 5:
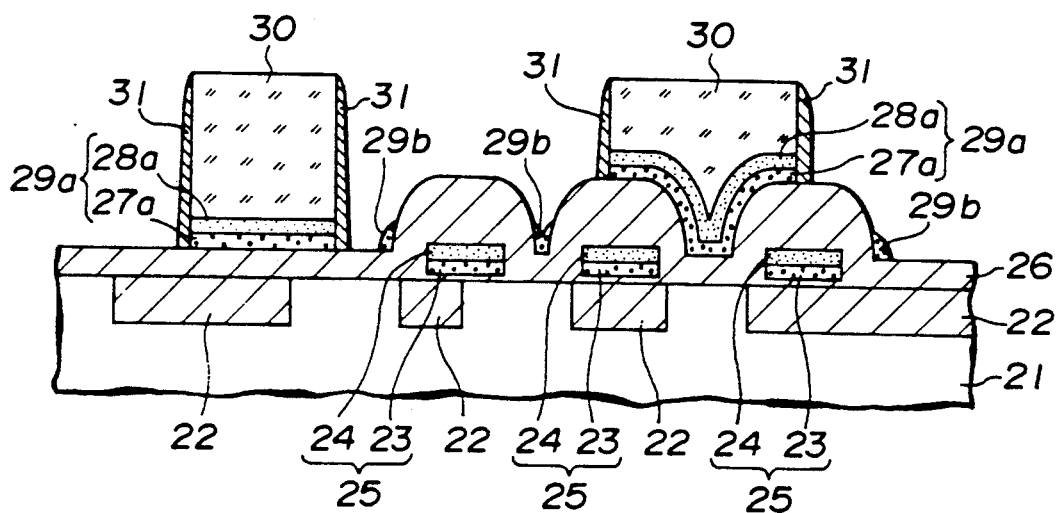
FIG. 5 is a schematic sectional view showing a stage where the second polycide film was patterned to form etching residues in FIG. 4.

Referring next to FIG. 5, the second-layer polycide film 29 was etched into an anisotropic shape as sidewall protection films 31 were formed. Consequently, bit lines 29a each with a nearly vertical wall was formed. Incidentally, individual material layers formed after patterning are identified by a subscript "a" added to the numerals for corresponding material layers.

However, since the wafer has large steps on the surface thereof, the second-layer polycide film 29 was not etched away completely, leaving etching residues 29b on the bottoms of the steps or on sections carrying closely spaced patterns. Most etching residues 29b were composed mainly of the polysilicon layer 27 but some further contained part of the $WSi_x$ layer 28. The etching residues 29b remained on those narrow sections which tend to decrease the quantity of etchant incident thereon and lower the vapor pressure on etching reaction products.

Figure 6:
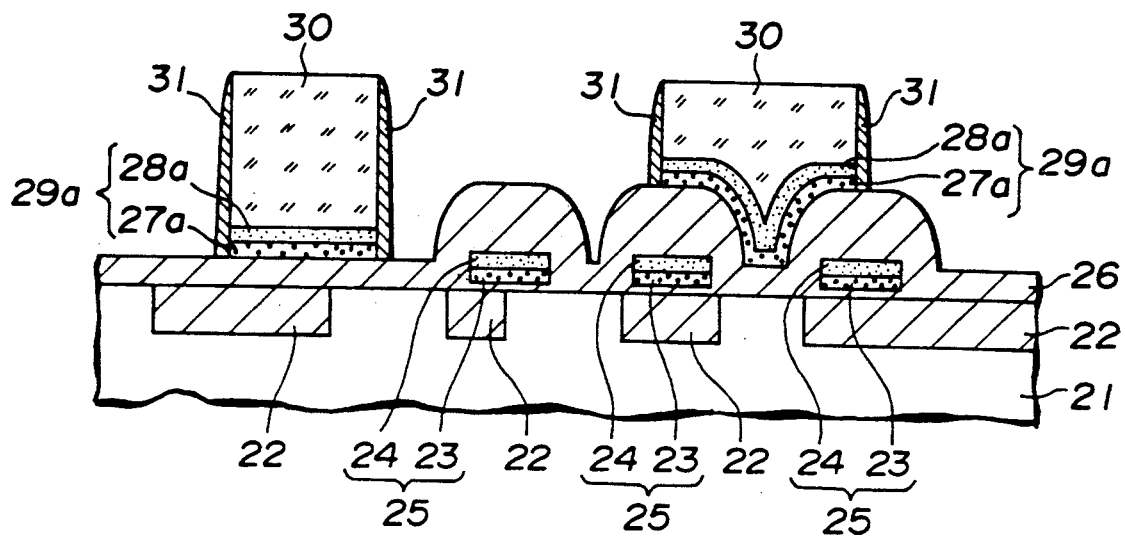
FIG. 6 is a schematic sectional view showing where the etching residues were removed in FIG. 5.

Then, the second-layer polycide film 29 was over-etched to remove the etching residues 29b, for instance, under the following conditions.
$SF_6$ flow rate: 50 SCCM
Gas pressure: 1.3 Pa (10 mTorr)
Microwave power: 850 W (2.45 GHz)
RF bias power: 0 W The above-mentioned etching conditions were set in such a manner that an etching reaction might proceed mainly by radicals. Specifically, $SF_6$ has the lowest S / F ratio of all sulfur fluorides and consequently releases from each molecule thereof the greatest quantity of F*, which served to remove the etching residues 29b immediately as shown in FIG. 6. At this time, the sidewall protection films 31, which had been formed in the above-mentioned just-etching process for the second-layer polycide film 29, had such excellent chemical and physical resistance to attacks by radicals or incident ions that the bit lines 29a would not have the sectional shape thereof deformed. Further, since no RF bias power was applied to the wafer, no other factor than a divergent magnetic field worked to accelerate ions in the direction of the wafer; nor was the underlying inter-layer insulation film 26 sputtered out to attach to the sidewalls of patterns.

Figure 7:
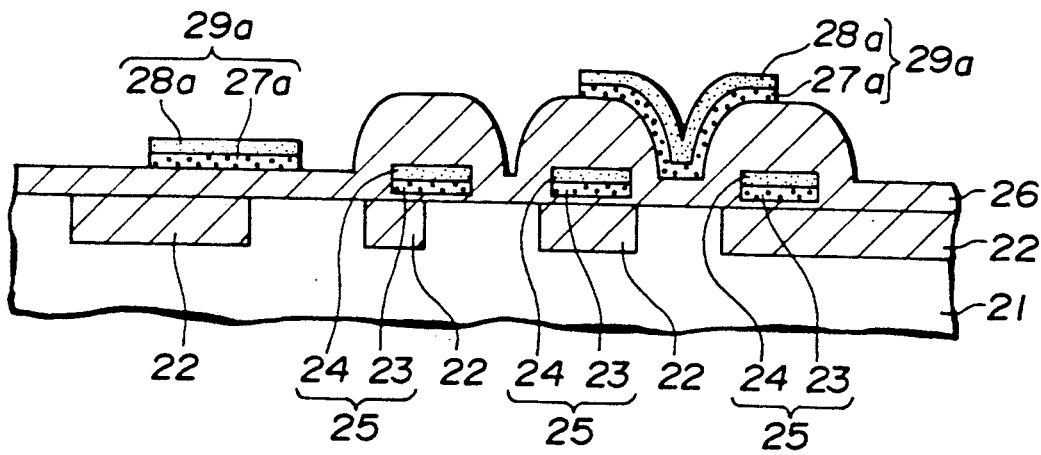
FIG. 7 is a schematic sectional view showing a stage where the resist mask was removed together with a sidewall protection film in FIG. 6.

Referring finally to FIG. 7, when the wafer was set on a plasma ashing apparatus to undergo ordinary $O_2$ plasma ashing, the resist masks 30 were removed while the sidewall protection films 31 were removed through sublimation, decomposition or combustion in the form of $N_2, NO_x, SO_x, S$, etc.

EXAMPLE 5

In this preferred Example, a dry etching method according to the present invention is applied following Example 4 to an SRAM bit line forming process where an Al based metallization layer was first just-etched by using $S_2Cl_2$ / $N_2$ mixed gas and then over-etched by using $Cl_2$ / $SF_6$ mixed gas to remove etching residues. This process is described by referring to FIGS. 8 to 11.

Figure 8:
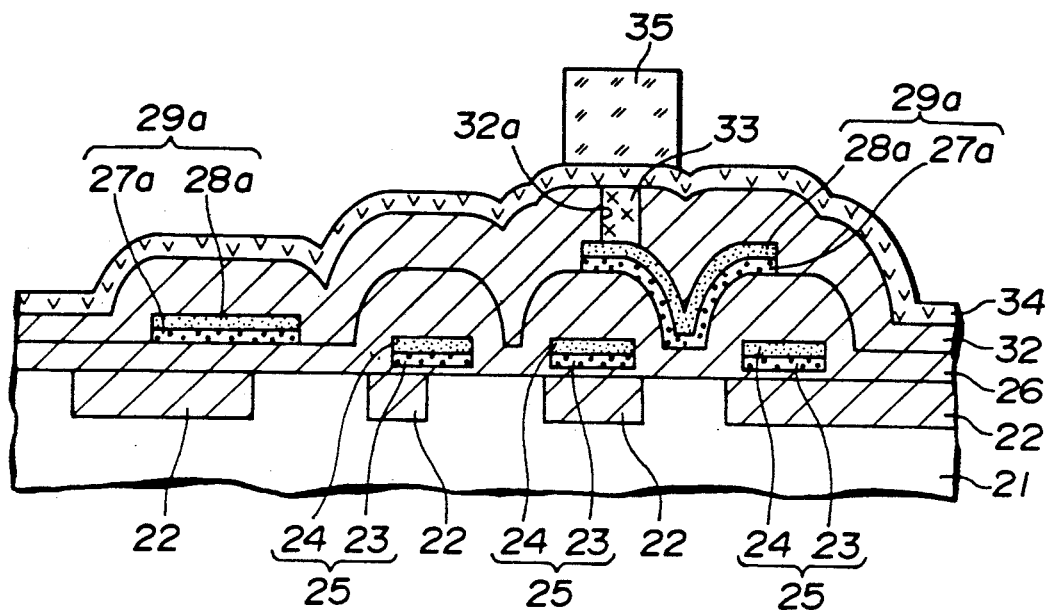
FIG. 8 is a schematic sectional view showing a stage of a dry etching method applied in still another preferred embodiment to an SRAM bit line forming process where a resist mask was formed on an Al based metallization layer.

Referring first to FIG. 8, there is illustrated a schematic sectional view showing the structure of a sample wafer to be etched according to the present Example. The wafer shown in FIG. 7 is coated on the whole surface thereof with an inter-layer insulation film 32 formed of $SiO_2$. A via-hole 32a is formed toward one of bit lines 29a and embedded flatly in a tungsten plug layer 33 grown, for instance, through selective CVD. The inter-layer insulation film 32 is coated on the whole surface thereof with an Al based metallization layer 34 formed through sputtering into a thickness of about 0.5 μM. The Al based metallization layer 34 is provided on the surface thereof with a resist mask 35.

The Al based metallization layer 34 constitutes a bit line to be formed together with the bit lines 29a formed of the second-layer polycide layer 29. To ensure low resistance of the bit line, the Al based metallization layer 34 is composed mainly of an about 0.4 μm thick Al—1% Si layer. In fact, an about 0.1 μm thick TiW barrier metal intervenes between the Al—1% Si layer and the inter-layer insulation layer 32. In the drawings, however, the Al—1% Si layer and the TiW barrier metal are shown collectively as the Al based metallization layer 34 for the sake of simplicity.

Incidentally, the resist mask 35 is composed, for instance, of novolac based positive photoresist (Supplied by Tokyo Ohka Kogyo Co., Ltd.; Product name: TSMR - V3) selectively exposed to g-lines and developed with alkali.

The sample wafer thus formed was set on a wafer supporting electrode provided on an RF biased magnetically enhanced microwave plasma etcher. In this state, the Al based metallization layer 34 was etched, for instance, under the following conditions:
$S_2Cl_2$ flow rate: 80 SCCM
$N_2$ flow rate: 20 SCCM
Gas pressure: 1.3 Pa (10 mTorr)
Microwave power: 850 W (2.45 GHz)
RF bias power: 100 W (2 MHz)
Wafer temperature: 25° C.

In the above-mentioned etching conditions, $S_2Cl_2$ released Cl*, which acted as a main etchant for the Al based metallization layer 34 while sulfur nitride based compounds, typically $(SN)_x$, deposited on the sidewalls of patterns by the same mechanism as in Example 1.

Figure 9:
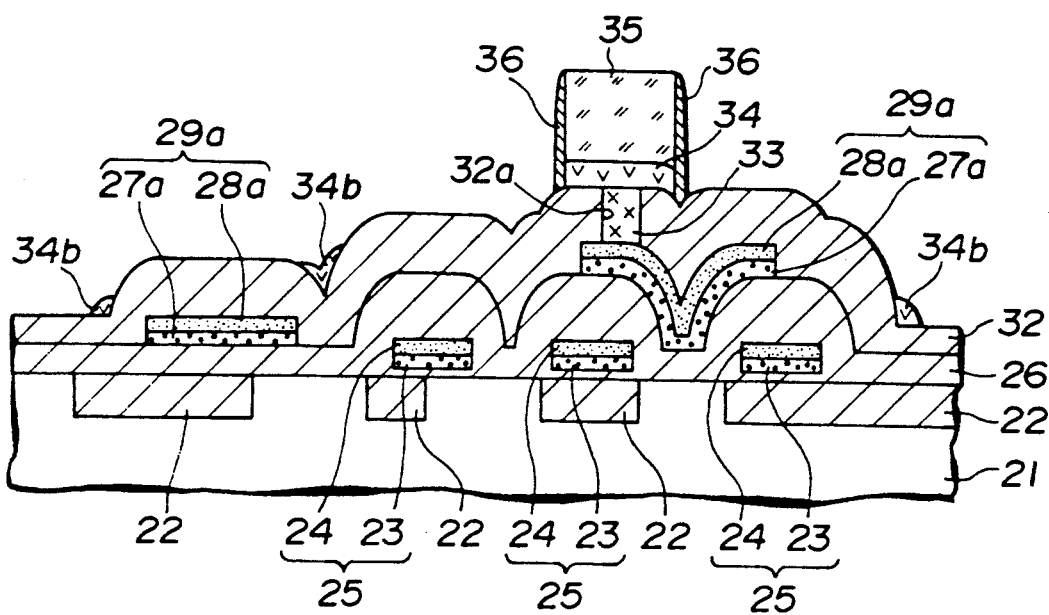
FIG. 9 is a schematic sectional view showing a stage where the Al based metallization layer was patterned to form etching residues in FIG. 8.

Referring next to FIG. 9, the Al based metallization layer 34 was etched into an anisotropic shape as sidewall protection films 36 were formed. Consequently, bit lines 34a each with a nearly vertical wall was formed. However, since the wafer has large steps on the surface thereof, the Al based metallization layer 34 was not etched away completely, leaving etching residues 34b on the bottoms of the steps or on sections carrying closely spaced patterns. Most etching residues 34b were composed mainly of the TiW barrier metal but some further contained part of the Al—1% Si layer.

Figure 10:
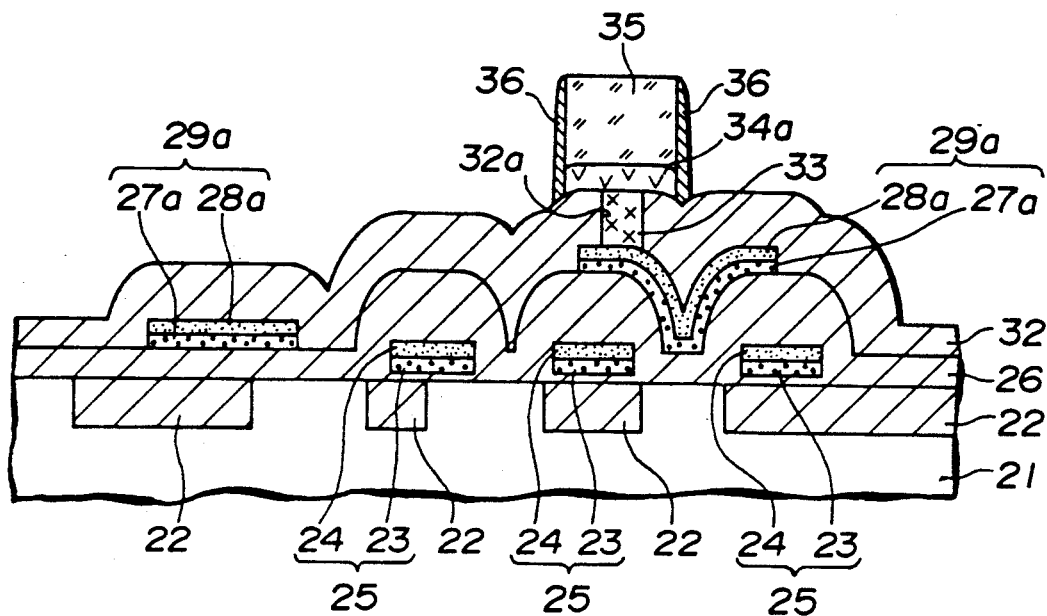
FIG. 10 is a schematic sectional view showing a stage where the etching residues were removed in FIG. 9.

Then, the Al based metallization layer 34 was over-etched to remove the etching residues 34b, for instance, under the following conditions.
$Cl_2$ flow rate: 50 SCCM
$SF_6$ flow rate: 50 SCCM
Gas pressure: 1.3 Pa (10 mTorr)
Microwave power: 850 W (2.45 GHz)
RF bias power: 0 W In the above-mentioned etching conditions, $Cl_2$ released Cl*, which served to capture Al and Ti for removal from the etching system in the form of chlorides. Similarly, $SF_6$ released F*, which served to capture W for removal in the form of fluorites. Consequently, the etching residues 34b were removed immediately as shown in FIG. 10. At this time, the sidewall protection films 36, which had been formed in the above-mentioned just-etching process for the Al based metallization layer 34, had such excellent sidewall protection effects that the bit lines 34a would not have the sectional shape thereof deformed.

Further, since no RF bias power was applied to the wafer, the underlying inter-layer insulation film 32 was not sputtered out to attach to the sidewalls of patterns. This is particularly significant in pattering the Al based metallization layer 34, because absence of such attachments means absence of residual chlorine occluded therein and considerable improvement in resistance to after-corrosion.

Figure 11:
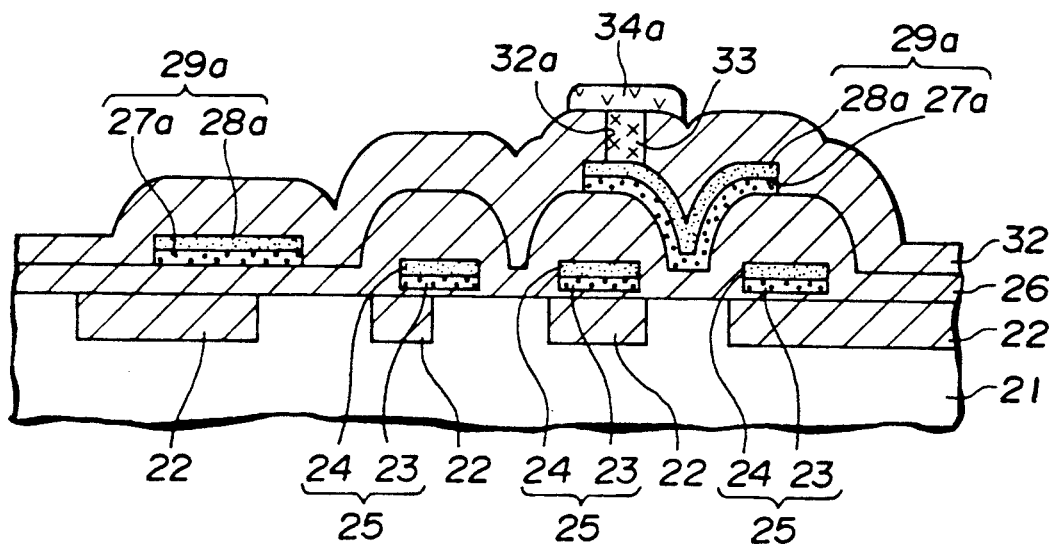
FIG. 11 is a schematic sectional view showing a stage where the resist mask was removed together with a sidewall protection film in FIG. 10.

Referring finally to FIG. 11, when the wafer was set on a plasma ashing apparatus to undergo ordinary $O_2$ plasma ashing, the resist mask 35 was removed while the sidewall protection films 36 were removed through sublimation, decomposition, or combustion. While the present invention has been described in five preferred Examples thereof, it is to be understood that the present invention is not limited to those Examples and that various changes and modifications may be made in the present invention without departing from the spirit and scope thereof. In the above-mentioned Examples of the present invention, $S_2F_2$ formed free sulfur in a plasma when dissociated by electric discharges. But such sulfur based compounds may vary depending on the type of a target material layer. As one instance, when the target material layer is a silicon based compound layer, $S_2F_2$ may be replaced by sulfur fluorides such as $SF_2$, $SF_4$, $S_2F_{10}$, sulfur chlorides such as $S_3Cl_2$, $S_2Cl_2$, and $SCl_2$, sulfur bromides such as $S_3Br_2$, $S_2Br_2$, and $SBr_2$, or $SOF_2$, $SOCl_2$, $SOBr_2$, $H_2S$, etc. As another instance, when the target material layer is an aluminum based compound layer, any of the above-mentioned sulfur based compounds excluding those containing fluorine atoms are available.

Further, in the above-mentioned Examples, etching gas contained $N_2$ which may be replaced by $N_2H_2$, $NF_3$, $NCl_3$, $NBr_3$, $NO_2$, etc. It is not preferable, however, to use $NH_3$, which will react with any of the above-mentioned sulfur based compounds to form ammonium sulfide as a reaction by-product.

Particularly, in Example 2, $H_2S$ was used to increase the apparent S / X ratio of the etching system but may be replaced by $H_2$, silane based compounds, etc. This effect can be most expected with silane based compounds, which, when dissociated by electric discharges, will release H* and Si*, both of which will serve to capture halogen radical (X*).

Moreover, etching gas may contain such rare gas as He and Ar for producing sputtering, cooling, and dilution effects.

What is claimed is:

1. A dry etching method comprising plasma etching a target material layer selected from the group consisting of silicon based materials and aluminum based materials deposited on a substrate by using etching gas containing a nitrogen based compound and a sulfur based compound capable of forming free nitrogen and sulfur, respectively, in a plasma when dissociated by electric discharges to form a side wall protection compound of sulfur nitride.

2. A dry etching method as claimed in claim 1 wherein said nitrogen based compound is at least one compound selected from the group consisting of $N_2$, $N_2H_2$, $NF_3$, $NCl_3$, $NBr_3$, and $NO_2$.

3. A dry etching method as claimed in claim 1 wherein said sulfur based compound is at least one compound selected from the group consisting of $S_2F_2$, $SF_2$, $SF_4$, $S_2F_{10}$, $S_3Cl_2$, $S_2Cl_2$, $SCl_2$, $S_3Br_2$, $S_2Br_2$, $SBr_2$, $SOF_2$, $SOCl_2$, and $SOBr_2$.

4. A dry etching method as claimed in claim 1 wherein said target material layer is any material selected from the group consisting of a single-crystal silicon layer, a polysilicon layer, an amorphous silicon layer, a refractory metal silicide layer, and a polycide film.

5. A dry etching method as claimed in claim 1 wherein said substrate is a single-crystal silicon substrate coated on the surface thereof with a gate oxide film, said target material layer being a polysilicon layer or polycide film.

6. A dry etching method as claimed in claim 1 wherein said substrate is coated on the surface thereof with an inter-layer insulation film, said target material layer being a polycide film or Al based material layer.

7. A dry etching method comprising plasma etching a target material layer selected from the group consisting of silicon based materials and aluminum based materials deposited on a substrate by using etching gas containing a nitrogen based compound, a sulfur based compound, and at least one halogen radical consuming compound selected from the group consisting of $H_2$, $H_2S$, and silane based compounds, said sulfur based compound and said nitrogen based compound forming free sulfur and nitrogen, respectively, in a plasma when dissociated by electric discharges to form a side wall protection compound of sulfur nitride.

8. A dry etching method as claimed in claim 7 wherein said nitrogen based compound is at least one compound selected from the group consisting of $N_2$, $N_2H_2$, $NF_3$, $NCl_3$, $NBr_3$, and $NO_2$.

9. A dry etching method as claimed in claim 7 wherein said sulfur based compound is at least one compound selected from the group consisting of $S_2F_2$, $SF_2$, $SF_4$, $S_2F_{10}$, $S_3Cl_2$, $S_2Cl_2$, $SCl_2$, $S_3Br_2$, $S_2Br_2$, $SBr_2$, $SOF_2$, $SOCl_2$, and $SOBr_2$.

10. A dry etching method as claimed in claim 7 wherein said silicon based material is any material selected from the group consisting of a single-crystal silicon layer, a polysilicon layer, an amorphous silicon layer, a refractory metal silicide layer and, a polycide film.

11. A dry etching method as claimed in claim 7 wherein said substrate is a single-crystal silicon substrate coated on the surface thereof with a gate oxide film, said target material layer being a polysilicon layer or polycide film.

12. A dry etching method as claimed in claim 7 wherein said substrate is coated on the surface thereof with an inter-layer insulation film, said target material layer being a polycide film or Al based material layer.

13. A dry etching method as claimed in claim 7 wherein said target material layer is etched in such a manner that it has a tapered sectional shape.

14. A dry etching method comprising
a step of plasma etching a target material layer selected from the group consisting of silicon based materials and aluminum based materials deposited on a substrate having a surface with grooves and steps by using etching gas containing a nitrogen based compound and s sulfur based compound capable of forming free nitrogen and sulfur, respectively, in a plasma when dissociated by electric discharges to form a side wall protection compound of sulfur nitride, and a subsequent step of removing etching residues of said target material layer form the bottoms of said steps and grooves mainly by etching with radicals.

15. A dry etching method as claimed in claim 14 wherein said nitrogen based compound is at least one compound selected from the group consisting of $N_2$, $N_2H_2$, $NF_3$, $NCl_3$, $NBr_3$, and $NO_2$.

16. A dry etching method as claimed in claim 14 wherein said sulfur based compound is at least one compound selected from the group consisting of $S_2F_2$, $SF_2$, $SF_4$, $S_2F_{10}$, $S_3Cl_2$, $S_2Cl_2$, $SCl_2$, $S_3Br_2$, $S_2Br_2$, $SBr_2$, $SOF_2$, $SOCl_2$, and $SOBr_2$.

17. A dry etching method as claimed in claim 14 wherein said silicon based material is any material selected from the group consisting of a singlecrystal silicon layer, a polysilicon layer, an amorphous silicon layer, a refractory metal silicide layer and a, polycide film.

18. A dry etching method as claimed in claim 14 wherein said substrate is a single-crystal silicon substrate coated on the surface thereof with a gate oxide film, said target material layer being a polysilicon layer or polycide film.

19. A dry etching method as claimed in claim 14 wherein said substrate is coated on the surface thereof with an inter-layer insulation film, said target material layer being a polycide film or Al based material layer.

20. A dry etching method comprising:
a step of plasma etching a target material layer selected from the group consisting of silicon based materials and aluminum based materials deposited on a substrate having grooves on the surface thereof by using an etching gas containing a nitrogen based compound, a sulfur based compound, which sulfur based compound and nitrogen based compound are capable of forming free sulfur and nitrogen, respectively, in a plasma when dissociated by electric discharges to form a sulfur nitride sidewall protection compound, and said gas having at least one halogen radical consuming compound selected from the group consisting of $H_2$, $H_2S$, and silane based compounds, and
a subsequent step of removing etching residues of said target material layer from the bottoms of said grooves mainly by etching with radicals.

21. A dry etching method as claimed in claim 20 wherein said nitrogen based compound is at least one compound selected from the group consisting of $N_2$, $N_2H_2$, $NF_3$, $NCl_3$, $NBr_3$, and $NO_2$.

22. A dry etching method as claimed in claim 20 wherein said sulfur based compound is at least one compound selected from the group consisting of $S_2F_2$, $SF_2$, $SF_4$, $S_2F_{10}$, $S_3Cl_2$, $S_2Cl_2$, $SCl_2$, $S_3Br_2$, $S_2Br_2$, $SBr_2$, $SOF_2$, $SOCl_2$, and $SOBr_2$.

23. A dry etching method as claimed in claim 20 wherein said target material layer is any material selected from the group consisting of a single-crystal silicon layer, polysilicon layer, amorphous silicon layer, refractory metal silicide layer, and polycide film.

24. A dry etching method as claimed in claim 20 wherein said substrate is a single-crystal silicon substrate coated on the surface thereof with a gate oxide film, said target material layer being a polysilicon layer or polycide film.

25. A dry etching method as claimed in claim 20 wherein said substrate is coated on the surface thereof with an inter-layer insulation film, said target material layer being a polycide film or Al based material layer.

* * * * *